United States Patent [19]
Suzuki et al.

[11] Patent Number: 6,026,041
[45] Date of Patent: *Feb. 15, 2000

[54] SEMICONDUCTOR MEMORY DEVICE

[75] Inventors: Takaaki Suzuki; Hiroyuki Kobayashi; Toyomitsu Matsumoto; Masao Taguchi; Yoshihiro Takemae, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/022,403

[22] Filed: Feb. 12, 1998

[30]  Foreign Application Priority Data

Sep. 24, 1997  [JP]  Japan .................................. 9-258600

[51] Int. Cl.$^7$ ...................................................... G11C 7/00
[52] U.S. Cl. ........................................................ 365/203
[58] Field of Search .............................. 365/230.06, 203, 365/222, 195

[56]  References Cited

U.S. PATENT DOCUMENTS

| 5,600,605 | 2/1997 | Schaefer ................................. 365/233 |
| 5,673,233 | 9/1997 | Wright et al. ........................... 365/233 |
| 5,703,831 | 12/1997 | Sawada ................................. 365/233 |
| 5,715,203 | 2/1998 | Uchida .................................. 365/203 |
| 5,818,777 | 10/1998 | Seyyedy ................................ 365/222 |

*Primary Examiner*—David Nelms
*Assistant Examiner*—Anh Phung
*Attorney, Agent, or Firm*—Nikaido, Marmelstein, Murray & Oram LLP

[57]  ABSTRACT

A semiconductor memory device includes a memory part which stores data, a decoder which decodes a command externally supplied to the semiconductor memory device, and a precharge protection circuit which dynamically determines, based on the command decoded by the decoder, a period necessary to precharge a predetermined circuit part of the semiconductor memory device, so that a precharge operation on the predetermined circuit part can be protected.

10 Claims, 9 Drawing Sheets

DQM TRUTH TABLE

| Function | Command | CKE n-1 | CKE n | DQML | DQMU |
|---|---|---|---|---|---|
| Data Write/Output Enable for Lower Byte | ENBL L | H | x | L | x |
| Data Write/Output Enable for Upper Byte | ENBL U | H | x | x | L |
| Data Mask/Output Disable for Lower Byte | MASK L | H | x | H | x |
| Data Mask/Output Disable for Upper Byte | MASK U | H | x | x | H |

SEMICONDUCTOR MEMORY DEVICE

BACKGROUND OF THE INVENTION

1. Field of the Invention

The present invention generally relates to semiconductor memory devices, and more particularly to a synchronous dynamic random access memory (SDRAM) device which operates in synchronism with an external clock signal. More specifically, the present invention is concerned with a precharge protection of the SDRAM device.

2. Description of the Related Art

Various types of semiconductor memory devices such as a DRAM device and an SDRAM device have been proposed. The semiconductor memory devices of different types are selectively used in terms of applications thereof. Recently, applications and systems have required DRAM devices having a large storage capacity. In the above situation, the SDRAM device is attractive which can operate in synchronism with an external clock signal having a very high speed.

The SDRAM device requires a refresh operation as in the case of the general DRAM devices. The recent DRAM devices have a plurality of refresh modes such as an auto refresh mode and a self refresh mode. The auto refresh mode requires an external clock and an external address, while the self refresh mode does not require them. The self refresh mode can hold data at the time of a system standby without external signals. More particularly, the self refresh mode activates a circuit which sequentially generates a row address, and a circuit which drives a row (word line) corresponding to the row address, and repeatedly performs a precharge operation. The auto refresh mode activates the circuit which sequentially generates the row address and the circuit which drives the row (word line) corresponding to the row address, and performs the precharge operation only one time.

The refresh mode in the general DRAM device is selected by controlling predetermined signals such as a column address strobe signal /CAS and a row address strobe signal /RAS at given timings. The above is called by command entry. For example, a CAS-before-RAS command makes entry of the auto refresh mode. After the cycle of the above entry, entry of the self refresh mode can be made by holding the column address strobe signal /CAS for a predetermined time (equal to, for example, 100 $\mu$m). The symbol "/" denotes an active-low signal.

In the SDRAM device, the auto refresh mode and the self refresh mode can be made by controlling a clock enable signal CKE which indicates whether the SDRAM device should receive a synchronous clock signal CLK, a chip select signal /CS, /RAS, /CAS and a write enable signal /WE. For example, entry of the auto refresh mode can be made when the clock enable signal CKE is successively high during two cycles in a state in which the signals /CS, /RAS, /CAS are each low (L) and the signal /WE is high (H). Entry of the self refresh mode can be made if the signals /CS, /RAS and /CAS are low and the write enable signal /WE is high at the time when the clock enable signal CKE switches from H to L. An external control of the SDRAM device can be interrupted at any time by applying a command synchronized with the clock signal thereto. The commands can be interpreted by a command decoder provided in the SDRAM device.

The normal read and write operations of the SDRAM devices can be carried out by applying corresponding commands thereto. In these operations, modes are set by applying commands in the order of an active mode and a precharge mode. In the active mode, the external address is received and recognized as a row address. Next, a circuit which selects a row select line corresponding to the recognized row address is activated. Then, a circuit which activates a sense amplifier corresponding to a column address to output data to a data bus is activated. In the precharge mode, only an address part which is contained in the row address and is related to a bank control is accepted and the precharge operation in the chip is initiated.

However, the above-mentioned DRAM and SDRAM devices have the following disadvantages.

Generally, in the DRAM and SDRAM devices, the self refresh command and the auto refresh command are inhibited from being applied thereto while an internal circuit is operating. This is an illegal state. However, in practice, the DRAM and SDRAM devices may be switched to a command acceptable state due to noise or an influence of an element in a peripheral circuit. If such a state happens, the refresh operation is carried out by the above command before the operation of a mode in an internal circuit is completed. This may destroy data. In other words, the self refresh mode or auto refresh mode is started before the precharge operation in each mode. Hence, it is necessary to define a certain period which ensure completion of the precharge operation and inhibits acceptance of any commands.

The conventional DRAM and SDRAM devices is equipped with a protection circuit which defines the above period. The protection circuit defines a precharge protection period for which the precharge operation is ensured. Generally, the precharge protection period is selected so as to be equal to the smallest one of precharge protection periods which are required in the respective modes. The smallest, namely, minimum precharge period is related to the data read or write operation. As has been described previously, the active mode and the precharge mode are set in this sequence in order to perform the data read/write operation. For the next data read or write, the active mode is set after the setting of the precharge mode, and then the precharge mode is set. That is, the setting of the active mode and the precharge mode is repeatedly carried out. The above protection period is determined based on the time of the precharge mode. The completion of the active mode is released by the setting of the precharge mode, which is set in the device.

The protection period thus determined is too short to protect the precharge in the self refresh mode and the auto refresh mode. In the self refresh mode and the auto refresh mode, the refresh operation is completed by a single command, and is different from the operations which are stopped by the next command. In the self refresh mode and the auto refresh mode, the sense operation of the sense amplifier is carried out as in the case of the normal read and write operations. A necessary and sufficient period is defined for the sense operation, and the precharge operation is automatically initiated immediately after the above period. The necessary and sufficient period for the sense operation is different from the period at the end of which period the sense operation in the active mode for the normal data read or write operation is terminated by a command input to the precharge mode, and is longer than the above period. Hence, if the sum of the period of the sense operation and that of the precharge operation is constant, a longer protection time can be defined for the self refresh mode and the auto refresh mode. However, in practice, the protection period is determined in common to each mode including the self refresh mode and the auto refresh mode. Since the protection period thus determined is too short to protect the precharge in the self refresh mode and the auto refresh mode, an error may occur in these modes due to noise or an influence of an element in the peripheral circuit. However, if an appropriate (longer) precharge protection period is defined for the auto refresh and self refresh modes, occurrence of such an error will be prevented.

SUMMARY OF THE INVENTION

It is a general object of the present invention to provide a semiconductor memory device in which the above disadvantages are eliminated.

A more specific object of the present invention is to provide a semiconductor memory device in which the precharge protection time dynamically depends on the selected mode so that data can be prevented from being destroyed and reliability can be improved.

The above objects of the present invention are achieved by a semiconductor memory device comprising: a memory part (which corresponds to banks 11 and 12) which stores data; a decoder (which corresponds to a command decoder 14) which decodes a command externally supplied to the semiconductor memory device; and a precharge protection circuit which dynamically determines, based on the command decoded by the decoder, a period necessary to precharge a predetermined circuit part of the semiconductor memory device, so that a precharge operation on the predetermined circuit part can be protected. Since the period necessary to precharge a predetermined circuit part is dynamically determined based on the contents of the decoded command (operation mode), it is possible to definitely protect the precharge operation and prevent data from being destroyed and to improve the reliability of the device.

Figure 6:
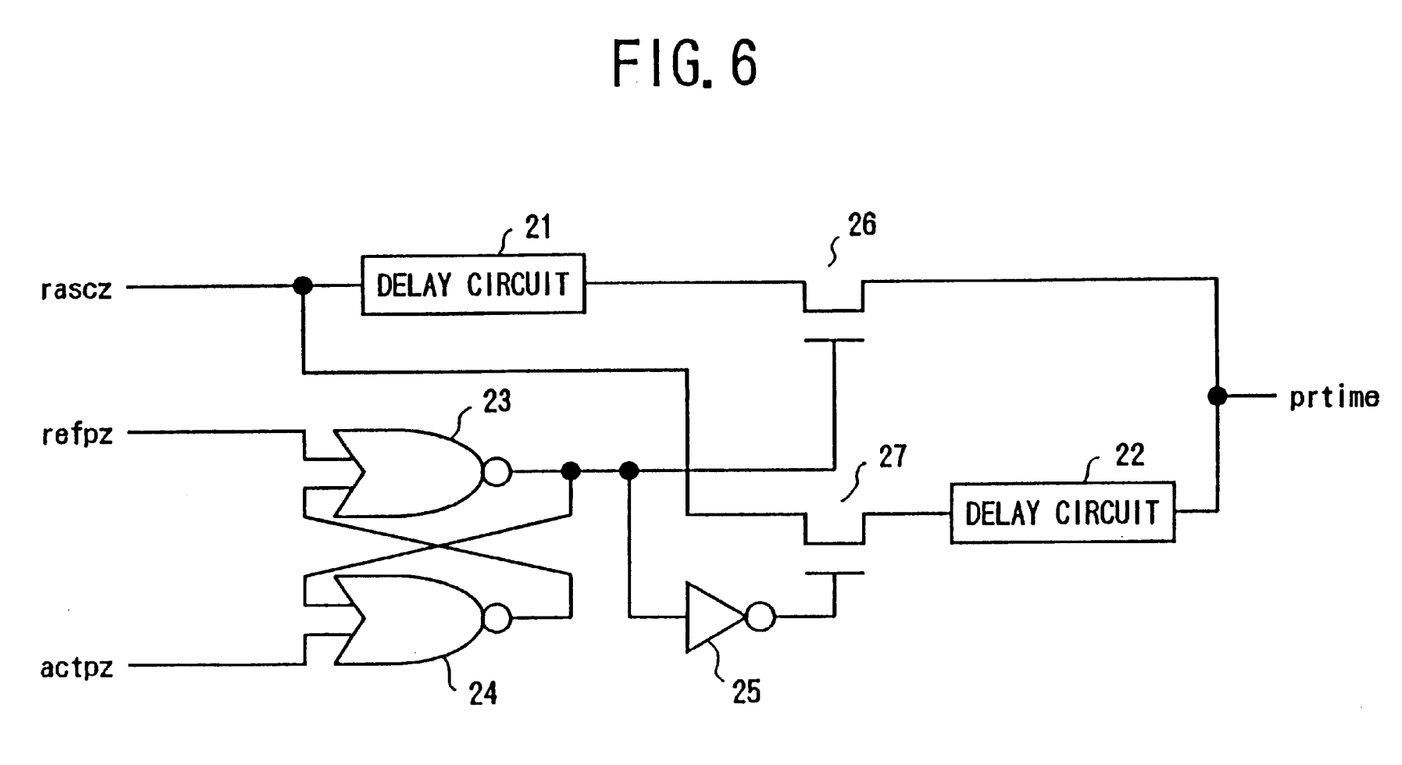
FIG. 6 is a circuit diagram of a first structure of a precharge protection circuit shown in FIG. 1.

The semiconductor memory device may be configured so that the precharge protection circuit comprises: a first circuit (which corresponds to NOR gates 23 and 24 in FIG. 6) which determines whether the command is a first command indicating an operation on data read or write or a second command indicating an operation on an internal refresh operation; and a second circuit (which corresponds to a combination of delay circuits 21 and 22, an inverter 25 and transistors 26 and 27 shown in FIG. 6) which sets a first precharge protection period (which corresponds to period B shown in FIG. 4A) for the first command and sets a second precharge protection period (which corresponds to period A shown in FIG. 4B) for the second command, the second precharge protection period being longer than the first precharge protection period.

The semiconductor memory device may be configured so that the first and second precharge protection periods start from an end of a sense operation of a sense amplifier. Hence, it is easy to dynamically set the precharge protection periods having different lengths.

The semiconductor memory device may be configured so that the second circuit sets the first precharge protection period in a default state. The above structure relates to FIG. 8 which will be described later.

The semiconductor memory device may be configured so that the second circuit sets the first precharge protection period in a default state and switches to the second precharge protection period when the second command is decoded. The above structure also relates to FIG. 8.

The semiconductor memory device may be configured so that the second circuit automatically switches to the first precharge protection period from the second precharge protection period after a given time elapses. The above structure is directed to use of a timer 30 which will be described later.

The semiconductor memory device may be configured so that: the first command includes commands indicating an active mode and a precharge mode defined in a dynamic random access memory; and the second command includes commands indicating a self refresh mode and an auto refresh mode defined in the dynamic random access memory.

The above objects of the present invention are also achieved by a semiconductor memory device comprising: a memory part which stores data; a command decoder (which corresponds to command decoder 14) which decodes a command externally supplied to the semiconductor memory device; a protection circuit (which corresponds to a protection circuit 11f) which generates, in response to an output signal of the command decoder, a protection signal which is kept active for a predetermined period; and a circuit (FIG. 7) which inhibits, when the output signal of the command decoder changes in the predetermined period, an operation based on a change of the output signal of the command decoder. Hence, it is possible to externally control the operation based on the output of the command decoder.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
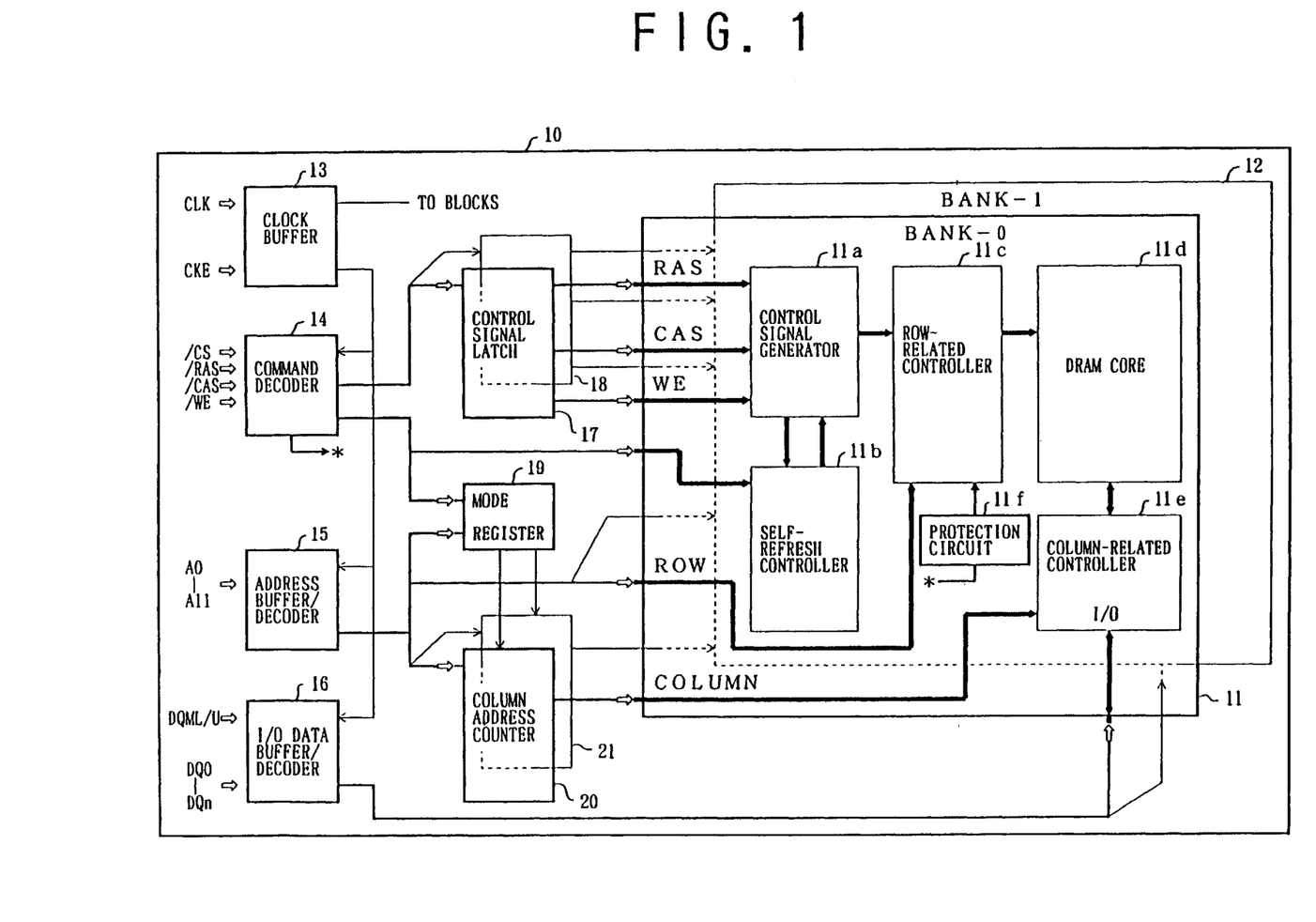
FIG. 1 is a block diagram of a semiconductor memory device according to an embodiment of the present invention.

FIG. 1 is a block diagram of an overall structure of an SDRAM device 10 according to an embodiment of the present invention.

The SDRAM device 10 includes a plurality of banks 11 (BAND-0) and 12 (BANK-1). Although FIG. 1 shows only two banks 11 and 12 for the sake of simplicity, the device can have banks more than two (for example, four banks). In the following, the SDRAM device 10 has only two banks 11 and 12 for the sake of convenience.

The banks 11 and 12 substantially have an identical structure. FIG. 1 shows the detail of the bank 11. The bank 11 includes a control signal generator 11a for internal circuits, a self refresh controller 11b, a row-related controller 11c, a DRAM core 11d, a column-related controller 11e, and a precharge protection circuit 11f. The structures of the above components of the bank 11 will be described in detail later.

The SDRAM device 10 further includes a clock buffer 13, a command decoder 14, an address buffer/decoder 15, an I/O data buffer/decoder 16, control signal latch circuits 17 and 18, a mode register 19 and column address counters 20 and 21.

The clock buffer 13 receives the clock signal CLK externally supplied for synchronization, and the clock enable signal CKE, which indicates whether SDRAM device 10 should accept the clock signal CLK. When the clock enable signal CKE is ON, the clock signal CLK is supplied to blocks of the SDRAM device 10. The clock enable signal CKE is read from the clock buffer 13, and is supplied to the blocks 14, 15 and 16.

The command decoder 14 decodes the chip select signal /CS, the row address strobe signal /RAS, the column address strobe signal /CAS and the write enable signal /WE, and generates various control signals therefrom. The control signals thus generated are applied to the control signal latch circuits 17 and 18, and the mode register 19.

Figure 2A:
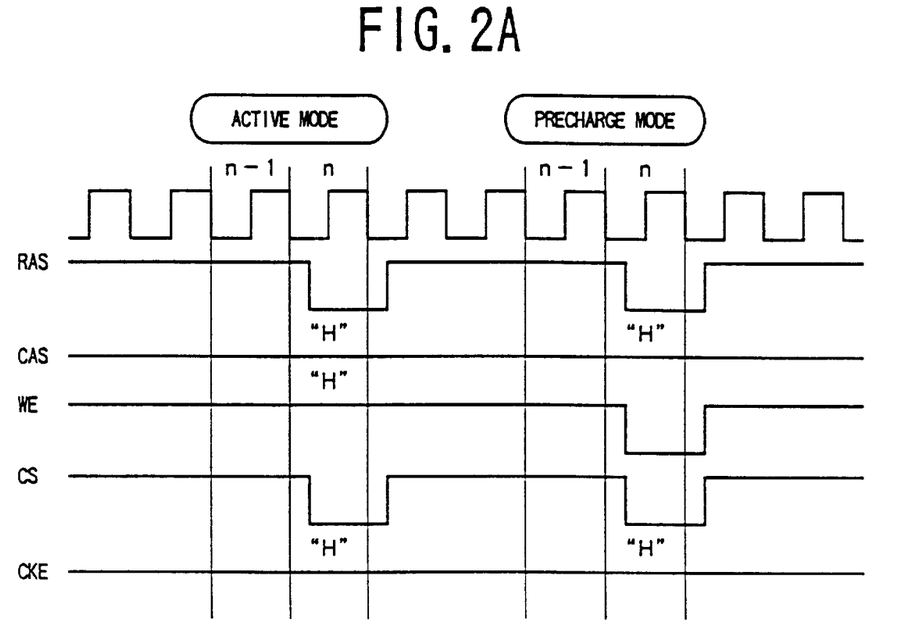
FIGS. 2A and 2B are timing charts of operation modes of the semiconductor memory device shown in FIG. 1.
Figure 2B:
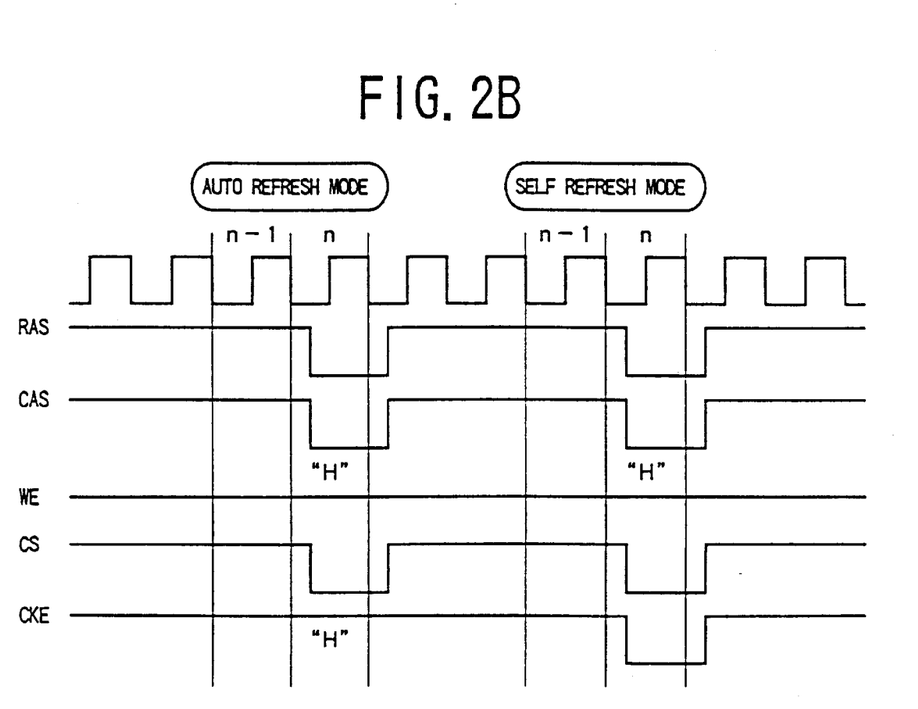

FIG. 2A shows command entries of the active mode and the precharge mode, and FIG. 2B shows command entries of the auto refresh mode and the self refresh mode. The command decoder 14 monitors the states (levels) of the signals in the (n−1)th cycle and the nth cycle, and decodes the commands.

A command which makes entry of the active mode is defined as follows:
 (1) The signals /CAS, /WE and CKE are successively high (H) in the (n−1)th and nth cycles; and
 (2) The signals /RAS and /CS are high in the (n−1)th cycle and are low in the nth cycle.

A command which makes entry of the precharge mode is defined as follows:
 (1) The signals /CAS and CKE are successively high in the (n−1)th and nth cycles; and
 (2) The signals /RAS, /WE and /CS are high in the (n−1)th cycle, and are low (L) in the nth cycle.

A command which makes entry of the auto refresh mode is defined as follows:
 (1) The signals CKE and /WE are successively high in the (n−1)th and nth cycles; and
 (2) The signals /CS, /RAS and /CAS are high in the (n−1)th cycle, and are low in the nth cycle.

A command which makes entry of the self refresh mode is defined as follows:
 (1) The signal /WE is successively high in the (n−1)th and nth cycles; and
 (2) The signals /CS, /RAS, /CAS and CKE are high in the (n−1)th cycle and are low in the nth cycle.

The address buffer/decoder 15 temporarily stores address signals A0–A11 and decodes them. A decoded signal is applied to the mode register 19, the banks 11 and 12 and the column address counters 20 and 21.

Figure 3:
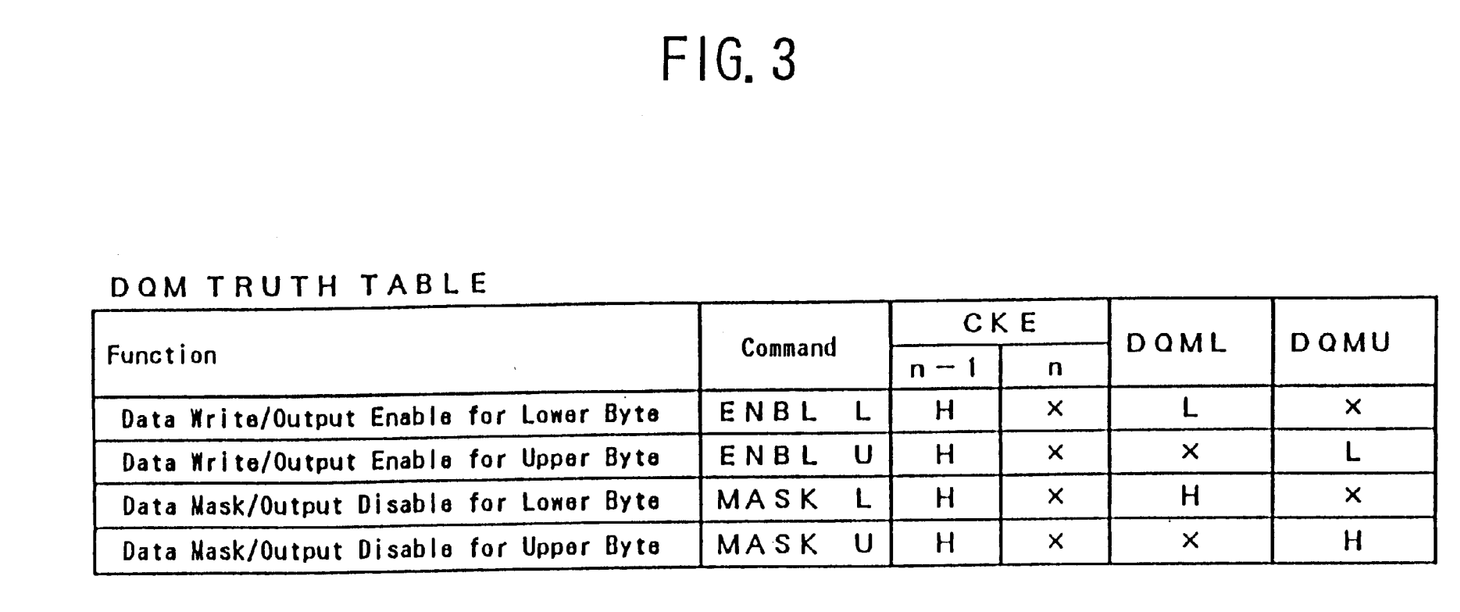
FIG. 3 is a diagram showing an operation of an I/O data buffer/decoder shown in FIG. 1.

The I/O data buffer/register 16 controls data inputting and outputting, and operates as shown in FIG. 3. For example, when a data control signal DQML is low (L) and the clock enable signal CKE is high (H) in the (n−1)th cycle, the write/output operation on the lower-side bits of data DQ0–DQ3 is activated.

The control signal latch circuits 17 and 18 receive the signals /RAS, /CAS and /WE from the command decoder 14, and outputs them to the banks 11 and 12.

The mode register 19 receives given decoded commands and decoded address signal, and sets predetermined operation modes such as a burst mode. In the burst mode, a give number of data bits is stored and written into selected memory cells. In order to realize the burst mode, the mode register 19 controls the count operations of the column address counters 20 and 21. The column address counters 20 and 21 count the decoded address signal, and generates the column address therefrom. When the burst mode is specified by the mode register 19, the column address counters 20 and 21 are made to change the respective count operations so that the column address is intermittently output.

As has been described previously, the bank 11 has the control signal generator 11a for controlling the internal circuits, the self refresh controller 11b, the row-related controller 11c, the DRAM core 11d and the column-related controller 11e.

The DRAM core 11d includes an array of memory cells arranged in a matrix formation, a group of sense amplifiers, a word decoder and a column decoder. Each memory cell includes one transistor and one capacitor. The sense amplifiers are connected to respective pairs of bit lines connected to the memory cells. The word decoder drives word lines connected to the memory cells. The column decoder drives the columns of the memory cell and connects the bit lines to bus lines.

The control signal generator 11a generates various control signals to be applied to the row-related controller 11c from the signals RAS, CAS and WE.

The row-related controller 11c includes a predecoder, a word decoder driver and a sense amplifier driver. The predecoder of the control signal generating circuit 11a receives the row address from the address buffer/decoder 15 and the corresponding control signal from the control signal generating circuit 11a, and generates a predecoded row address signal therefrom. The predecoded row address signal is supplied to the DRAM core 11d. The word decoder driver drives the word decoder provided in the DRAM core 11d according to the corresponding control signal supplied from the control signal generating circuit 11a. The sense amplifier driver of the row-related controller 11c drives the sense amplifiers in the DRAM core 11d in accordance with the corresponding control signal from the control signal generating circuit 11a.

The column-related controller 11e includes a predecoder and an I/O data selector. The predecoder generates a predecoded column address signal to be supplied to the column decoder provided in the DRAM core 11d from the column address generated by the column address counter 20. The predecoded column address signal is applied to the column decoder provided in the DRAM core 11d. The I/O data selector provided in the column-related controller 11e selects read data to be output to the I/O data buffer/decoder 16 in accordance with the column address, and selects write data to be written into the selected memory cell.

The present invention decodes a command externally supplied, and dynamically determines, based on the operation mode specified by the command, the time necessary to precharge a predetermined part of the semiconductor memory device, that is, the precharge protection time. More particularly, the precharge protection period for the active mode at the time of reading data and writing data is defined separately from the precharge protection period for the self refresh and auto refresh modes, wherein the latter protection period is longer than the former one. This will be described with reference to FIGS. 4A and 4B, in which the self refresh mode, the auto refresh mode, the active mode and the precharge mode are respectively referred to as modes 1, 2, 3 and 4.

Figure 4A:
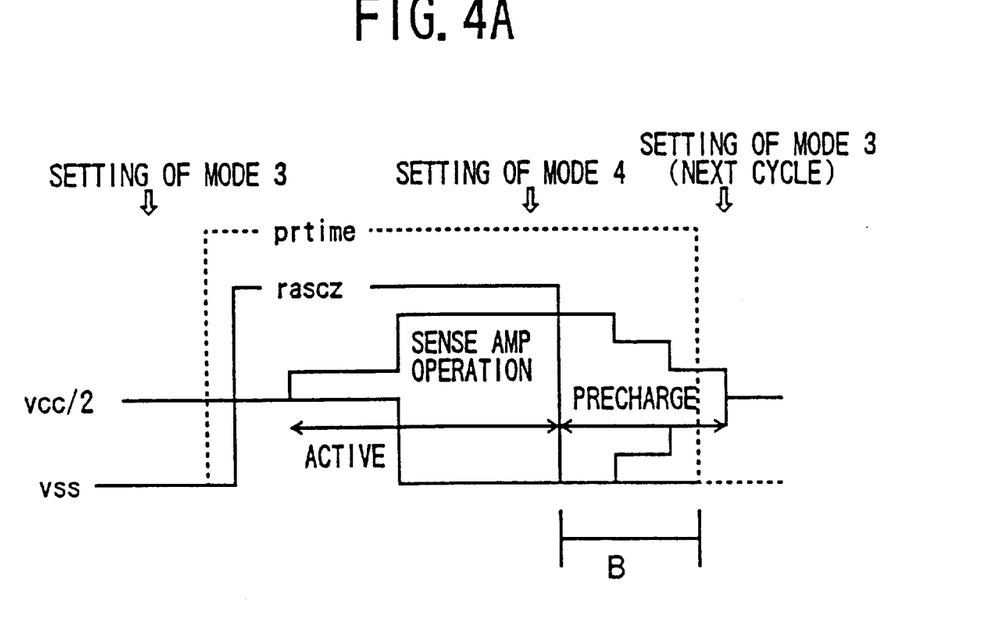
FIGS. 4A and 4B are timing charts showing the principle of the present invention.
Figure 4B:
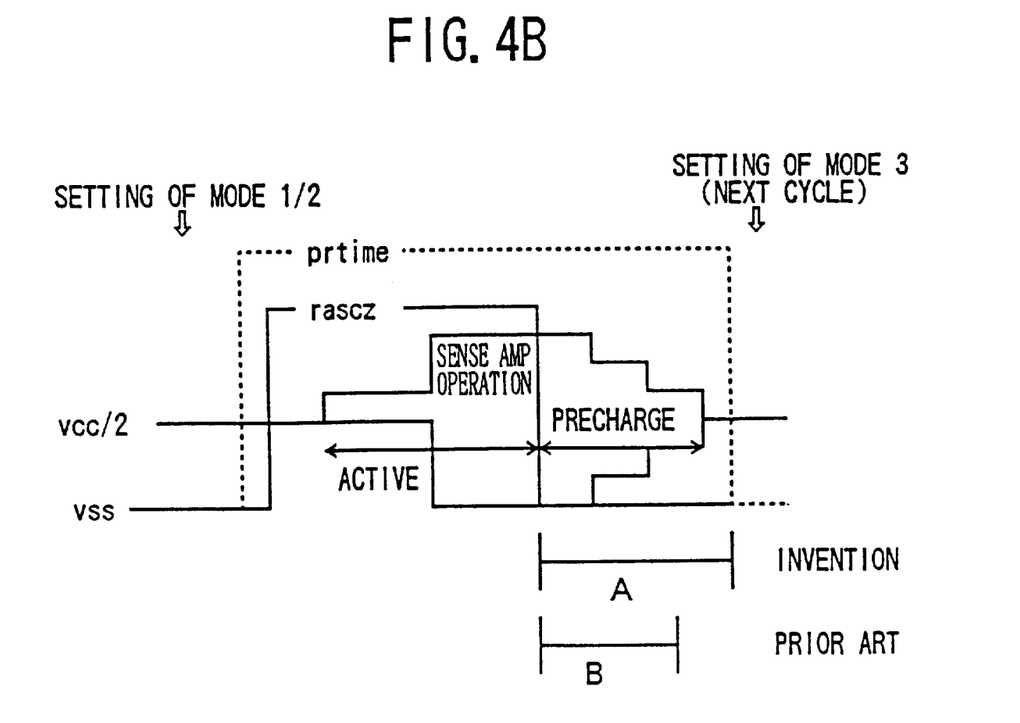

FIG. 4A schematically shows a change of the potentials of a pair of bit lines in the modes 3 and 4. FIG. 4B schematically shows a change of the potentials of a pair of bit lines in the modes 1 and 2. Referring to FIG. 4A, a command which requests the mode 3 is decoded by the command decoder 14 shown in FIG. 1, and a signal rascz, which will be described later, is made to rise, so that the bank is activated. Then, the word line is selected and the sense amplifier is driven, so that the potentials of the paired bit lines are changed from a precharge potential Vcc/2 to Vcc and Vss where Vcc is a power supply voltage and Vss is the ground potential. In the above state, when a command which requests the mode 4 is decoded by the command decoder 14 and the signal rascz is made to fall. Hence the paired bit lines are precharged to Vcc/2 (reset). Next, the mode 3 is set as described above, and data read/write operation is carried out. An interval B between the setting of the mode 4 and that of the mode 3, that is, an operation protecting period B is equal to the minimum period among the precharge protection periods for the respective modes. The next cycle of the mode 3 is inhibited from being set before the operation protecting period B elapses. The minimum period is defined so as to end immediately before the paired bit lines completely return to the potential Vcc/2 in order to obtain the operation as fast as possible, as shown in FIG. 4A. As has been described previously, the signal rascz is released by the setting of the mode 4. However, in practice, the sense operation of the sense amplifier is completed before the bit lines completely return to the potential Vcc/2. In other words, it is possible to turn OFF the signal rascz at a time earlier than the time when the mode 4 is set. In FIGS. 4A and 4B, a reference "prtime" denotes the operation protecting period in the modes 3 and 4.

FIG. 4B shows a change of the potentials of a pair of bit lines in the modes 1 and 2. A command which requests the mode 1 or 2 is decoded by the command decoder 14, and the signal rascz is made to rise, so that the bank is activated. The signal rascz is automatically turned OFF after a given period which ensures the sense amplifier operation. Subsequently, the paired bit lines are precharged. If the operation period prtime shown in FIG. 4B is made equal to the operation protection time prtime shown in FIG. 4A, the precharge protection period A shown in FIG. 4B can be longer than the precharge protection period B. In the precharge protection period A, the paired bit lines are completely precharged to Vcc/2. Hence, it is possible to eliminate a possibility that data may be destroyed due to noise or an influence of an element in the peripheral circuit.

In the prior art, the single precharge protection period is defined. More particularly, the period B starting from the signal rascz in the modes 3 and 4 is defined as the precharge protection period. Hence, even in the modes 1 and 2, the precharge operation is ensured only for the period B after the signal rascz falls.

In contrast, the present invention defines the precharge protection period A in the modes 1 and 2 which is longer than the precharge protection period B in the modes 3 and 4. The setting of the precharge protection periods A and B is carried out by the precharge protection circuit 11f shown in FIG. 1. The precharge protection circuit 11f receives a given signal from the command decoder 14, and sets the operation protecting period prtime. The operation protecting period prtime in the modes 1 and 2 may be equal to or different from that in the modes 3 and 4.

A description will now be given of an internal structure of the command decoder 14 and an internal structure of the precharge protection circuit 11f.

Figure 5:
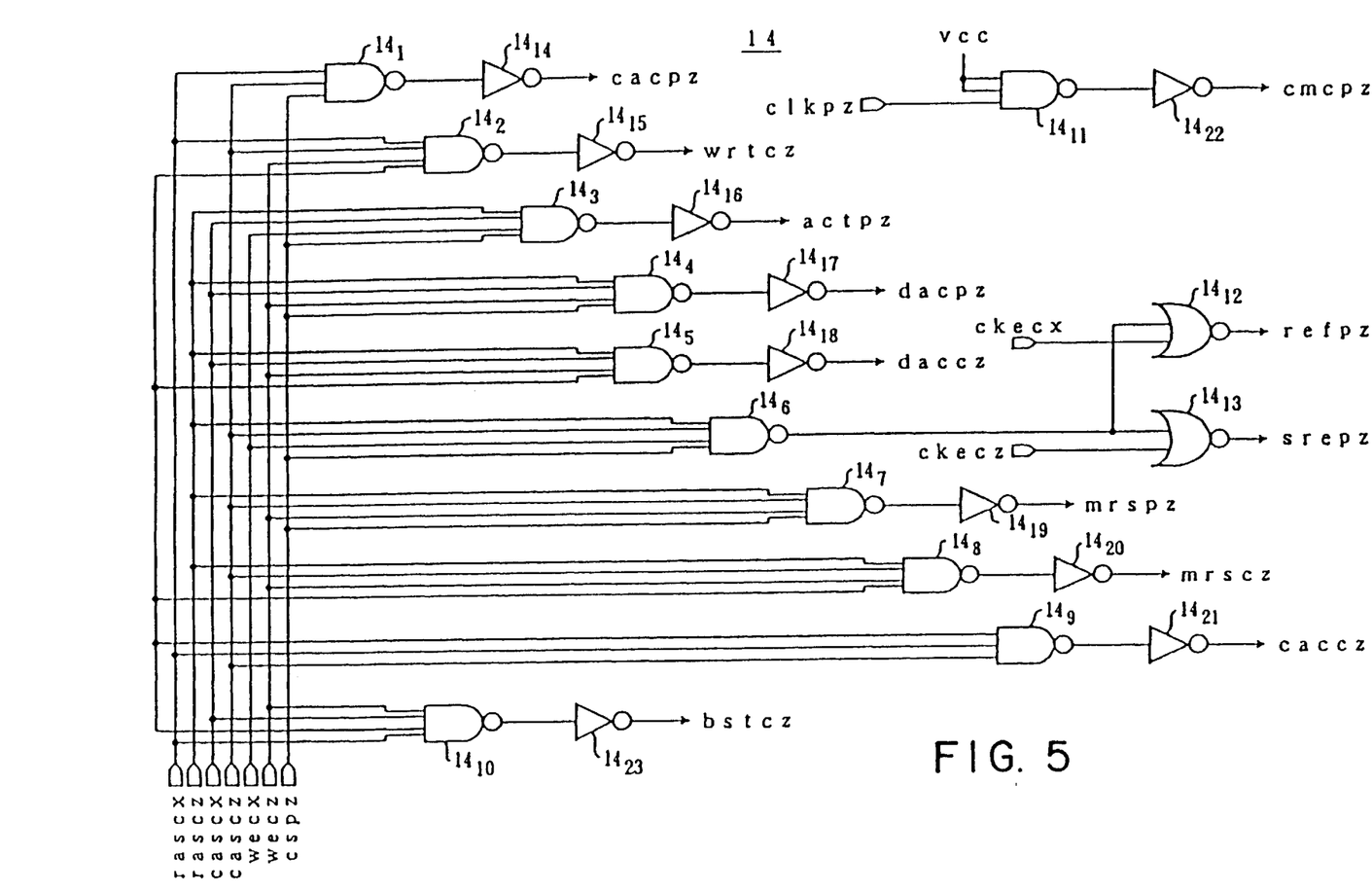
FIG. 5 is a circuit diagram of a command decoder shown in FIG. 1.

FIG. 5 is a circuit diagram of the internal structure of the command decoder 14. As shown in FIG. 5, the command decoder 14 receives signals rascx, rascz, cascx, cascz, wecx, wecz an cspz, and generates various decoded signals therefrom. The signals rascx, cascx and wecx correspond to the aforementioned signals /RAS, /CAS and /WE, respectively. The signals rascz, cascz, wecz and cspz are respectively the inverted versions of the signals /RAS, /CAS, /WE and /CS. Further, the command decoder 14 receives an inverted version clkpz of the clock signal CLK and signals ckecx and ckecz, which correspond to the clock enable signal CKE and its inverted version, respectively.

The command decoder 14 includes NAND gates $14_1$–$14_{11}$, NOR gates $14_{12}$–$14_{13}$, and inverters $14_{14}$–$14_{23}$. The above-mentioned signals input to the command decoder 14 are decoded by the above-mentioned logic elements, and decoded signals are generated. For example, the auto refresh command is detected by the NAND gate $14_6$ and the NOR gate $14_{12}$, and a decoded signal refpz is output from the NOR gate $14_{12}$. That is, the NAND gate $14_6$ and the NOR gate $14_{12}$ performs a logical operation related to the auto refresh command. The self refresh command is detected by the NAND gate $14_6$ and the NOR gate $14_{13}$, and a decoded signal srepz is output from the NOR gate $14_{13}$. That is, the NAND gate $14_6$ and the NOR gate $14_{13}$ performs a logical operation related to the self refresh command. The present invention can make entry of the self refresh mode by the above operation even if no decoded signal is generated. The decoded signals refpz and srepz are applied to the self refresh controller 11b shown in FIG. 1.

A decoded signal wrtcz output from the inverter $14_{15}$ activates a circuit which generates the row address and circuits related to the auto refresh mode. A decoded signal cacpz output by the inverter $14_{14}$ activates the circuit which generates the row address and circuits related to the active mode. A decoded signal dacpz output by the inverter $14_{17}$ activates circuits related to the precharge operation. The above commands cacpz, wrtcz and dacpz are applied to the self refresh controller 11b shown in FIG. 1.

A decoded signal mrspz output by the inverter $14_{19}$ specifies a given mode such as the aforementioned burst mode. A decoded signal mrscz output by the inverter $14_{20}$ indicates a reset of the given mode. The decoded signal mrspz is applied to the self refresh controller 11b and the mode register 19. A decoded signal mrscz is applied to the mode register 19. A decoded signal bstcz output by the inverter $13_{23}$ is applied to the control signal latch circuits 17 and 18 and the self refresh controller 11b. The output signal of the inverter $14_{21}$ indicates cancellation of the column address strobe signal /CAS, and is applied to the control signal latch circuits 17 and 18 and the self refresh controller 11b. The signal clkpz corresponding to the clock signal CLK is converted into an internal clock signal cmcpz by the NAND gate $14_{11}$ and the inverter $14_{22}$.

FIG. 6 is a circuit diagram of a first possible structure of the precharge protection circuit 11f, which is made up of delay circuits 21 and 22, NOR gates 23 and 24, an inverter 25 and transistors 26 and 27. The delay circuit 21 delays the trailing edge of the decoded signal rascz by the precharge protection period B, and outputs a signal prtime which indicates the operation protecting period prtime shown in FIG. 4A. The delay circuit 22 delays the trailing edge of the decoded signal rascz by the precharge protection period A, and outputs a signal prtime which indicates the operation protecting period prtime shown in FIG. 4B. A delay circuit capable of delaying the trailing edge of a signal is known, and a description of the internal circuit thereof will be omitted here. The NOR gates 23 and 24, which form a flip-flop, receive the decoded signals refpz and actpz, and output signals which control the transistors 26 and 27. The signal refpz is made active when the decoded signal indicates the mode 1 or mode 2, and is active in all the modes 1–4 after the decoded signal actpz rises and before the signal rascz rise. When only the decoded signal acptz rises to the high level, the output of the NOR gate 23 is set to the high level. Hence, the transistor 26 is turned ON, and the transistor 27 controlled via the inverter 25 is t urged OFF. In the modes 3 and 4, the decoded signal actpz rises to the high level and then the decoded signal refpz rises to the high level. Hence, the output signal of the NOR gate 23 is switched to the low level, and the transistor 27 is turned ON. The delay circuit 22 receives the signal rascz via the transistor 27, and delays the trailing edge thereof by the precharge protection period A. Then, the delayed version of the signal rascz is output by the delay circuit 22.

As described above, only the delay circuit 21 is selected in the mode 3 or mode 4 so that the precharge protection period B is set, while both the delay circuits 21 and 22 are selected so that the precharge protection period A is set. The signal thus generated and indicative of the operation protecting period prtime is applied to the row-related controller 11c shown in FIG. 1.

Figure 7:
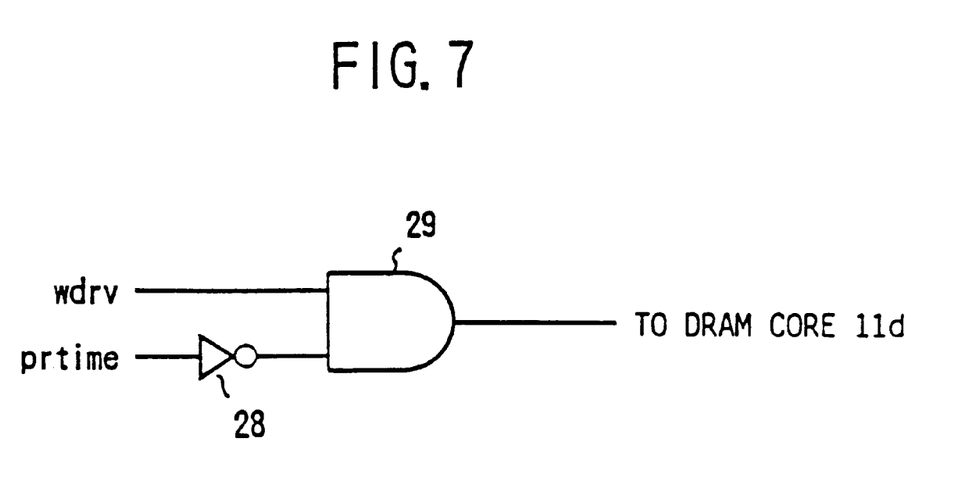
FIG. 7 is a circuit diagram of a part of a row-related controller shown in FIG. 1.

FIG. 7 is a circuit diagram of a part of the row-related controller 11c. A word line drive signal wdrv generated by the row-related controller 11c is applied to the corresponding word line via an AND gate 29. The above-mentioned signal prtime is applied to the AND gate 29 via an inverter 28. Hence, the AND gate 29 is in the closed state for the operation protecting period prtime, so that the word line drive signal wdrv is prevented from being output.

Figure 8:
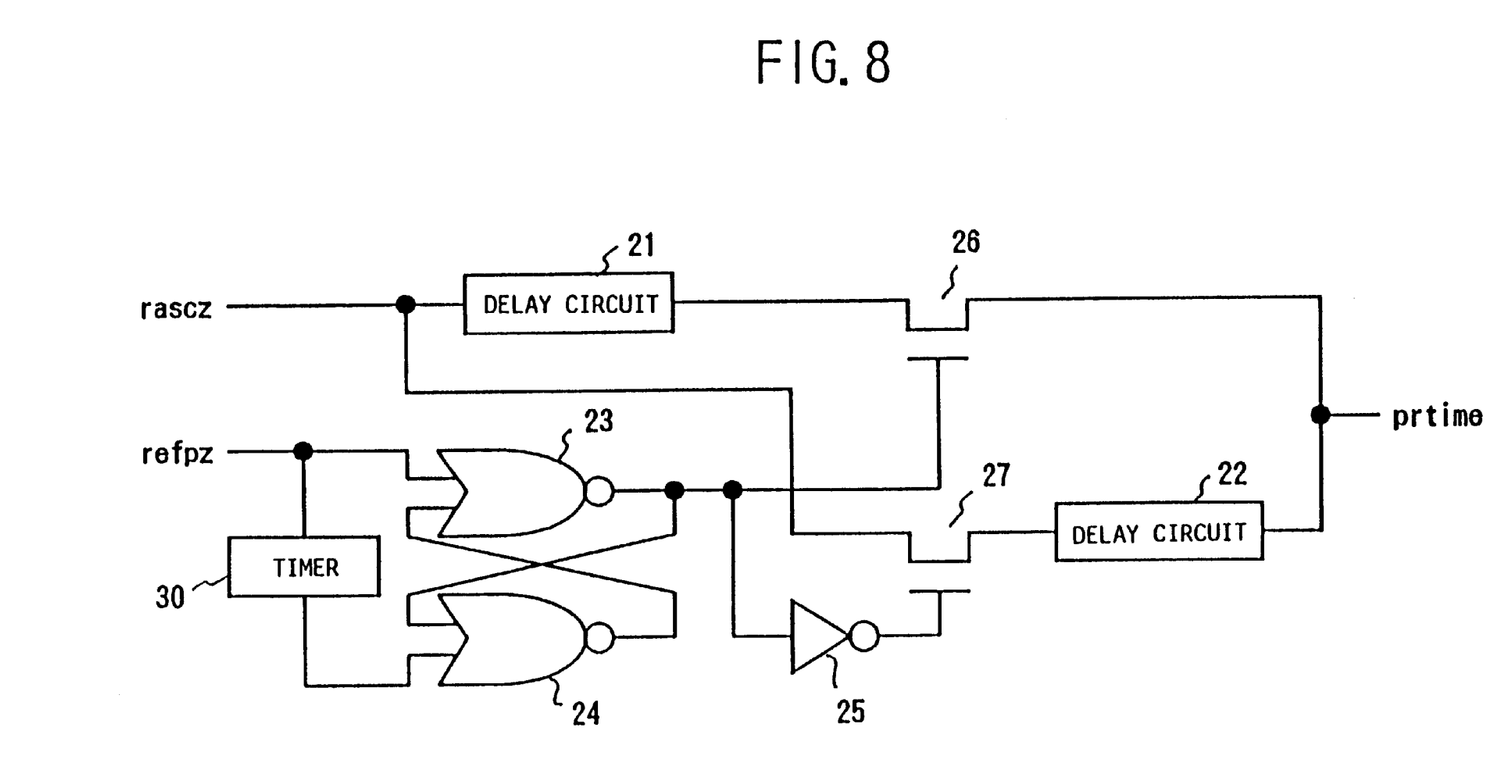
FIG. 8 is a circuit diagram of a second structure of the precharge protection circuit shown in FIG. 1.

FIG. 8 is a circuit diagram of a second structure of the precharge protection circuit 11f. In the second structure, the precharge protection period B is set as a default setting, and the precharge protection period A is set instead of the period B when the mode 1 or mode 2 is specified. After a predetermined time elapses, the setting of the precharge protection period is automatically returned to the period B. This is arranged by taking into consideration a situation in which the mode 3 or the mode 4 is more frequently requested than the mode 1 or mode 2. With the above arrangement of the second structure, it is possible to reduce the number of times that the transistors 26 and 27 perform the switching operations and to reduce the power consumption.

In order to realize the above arrangement, the structure shown in FIG. 6 is modified so as to provide a timer 30, as shown in FIG. 8. The timer 30 starts its operation upon receipt of the decoded signal refpz which is switched to the high level when the mode 1 or 2 is set, and outputs the high-level signal when measuring a predetermined time. Hence, the output of the NOR gate 23 is switched from the low level to the high level, and the transistors 26 and 27 are turned ON and OFF, respectively. As described above, in the normal state (default), the transistor 26 is ON and the delay circuit 21 is thus selected. When the mode 1 or the mode 2 is selected, the delay circuit 22 is selected in addition to the delay circuit 21. Then, the precharge protection circuit 11f is returned to the default state after the predetermined time elapses.

Figure 9:
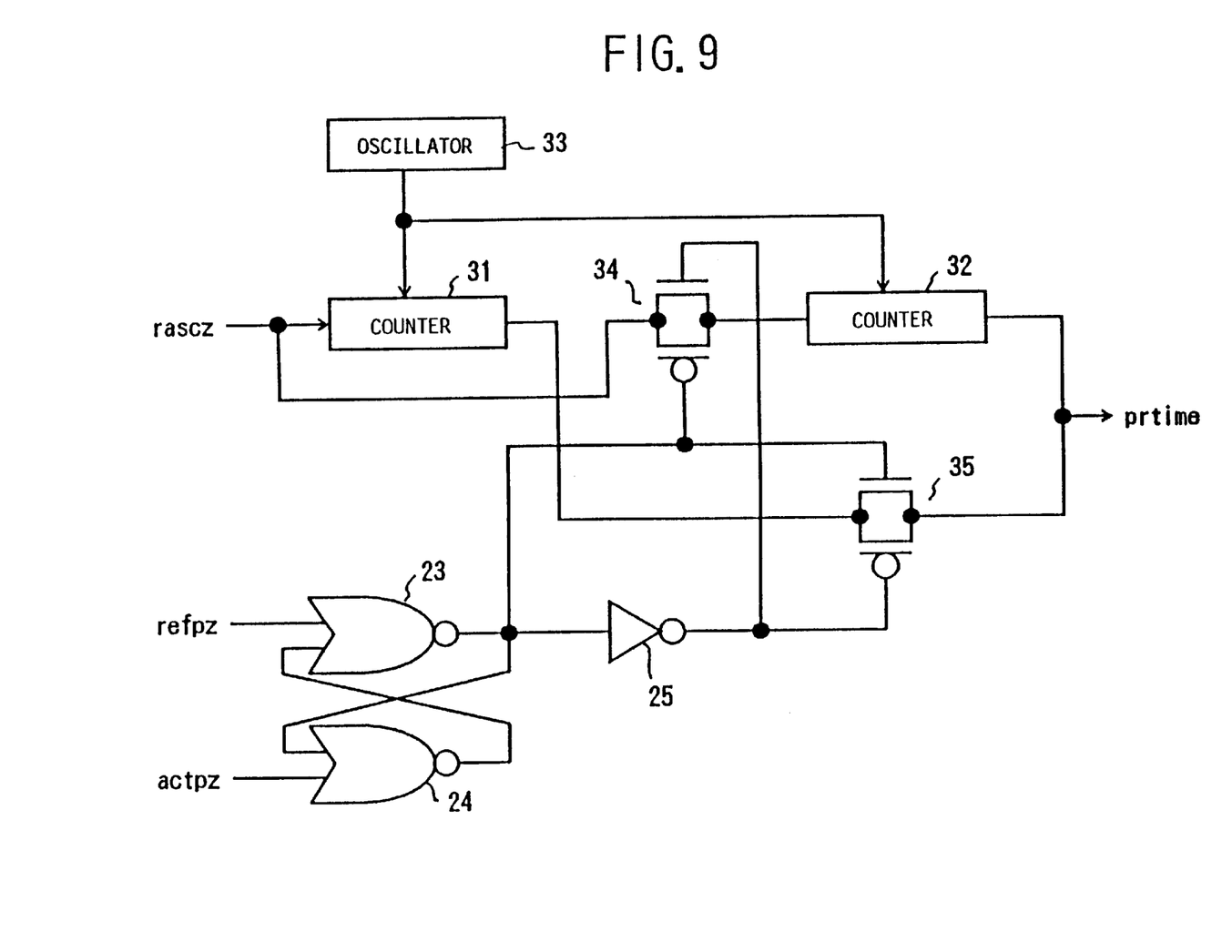
FIG. 9 is a circuit diagram of a third structure of the precharge protection circuit shown in FIG. 1.

FIG. 9 is a circuit diagram of a third structure of the precharge protection circuit 11f, which employs an oscillator 33 and counters 31 and 32. The precharge protection circuit 11 shown in FIG. 9 includes analog switches 34 and 35 in addition to the aforementioned NOR gates 23 and 24, the inverter 25, the counters 31 and 32 and the oscillator 33.

Each of the analog switches 34 and 35 includes a p-channel field effect transistor and an n-channel field effect transistor. When the signal rascz is switched to the high level, the counter 31 starts to count the output pulse of the oscillator 33. In any of the modes, the output signal of the NOR gate 23 is initially high, and the switches 35 and 34 are ON and OFF, respectively. Hence, the high-level output of the counter 31 is output via the switch 35. After the signal rascz is switched to the low level, the counter 31 continues the count operation for the precharge protection period B, and switches its output signal to the low level when the period B elapses.

When the mode 1 or the mode 2 is set, the signal actpz is switched to the high level, and then the signal refpz is switched to the high level. Hence, the output signal of the NOR gate 23 is switched to the low level, and the transistors 34 and 35 are turned ON and OFF, respectively. When the signal rascz rises, the counter 32 starts to operate, and sets its output signal to the high level. The counter 32 continues the count operation for the precharge protection period A even after the signal rascz falls, and switches its output signal to the low level when the period A elapses.

As described above, the precharge protection period for the auto refresh and self refresh modes is dynamically set to a sufficient length, and it is thus possible to prevent occurrence of various erroneous operations such as destroy of data due to the insufficient precharge protection period or incomplete precharge. For example, in a case where the auto refresh mode is successively requested for the same bank, if the precharge is insufficient and there is a noise, data remaining on the bit lines will affect the next refresh operation, and data in the memory cells may be destroyed. The sufficient precharge protection period A of the present invention can completely eliminate such a possibility.

The present invention is not limited to the specifically disclosed embodiments, and variations and modifications may be made without departing from the scope of the present invention.

What is claimed is:

1. A semiconductor memory comprising:
   a decoder which decodes a command externally supplied to the semiconductor memory and outputs a command signal; and
   a precharge protection circuit coupled to the decoder, outputting a precharge protection signal,
   wherein a protection period of the precharge protection signal is set to a different time in response to the command signal in the precharge protection circuit.

2. The semiconductor memory device comprising:
   a decoder which decodes a command externally supplied to the semiconductor memory and outputs a command signal; and
   a precharge protection circuit coupled to the decoder, outputting a precharge protection signal, wherein
   a protection period of the precharge protection signal is set to a different time in response to the command signal in the precharge protection circuit;
   the decoder determines whether the command is a first command indicating an operation on data read or write or a second command indicating an operation on an internal refresh operation; and
   the precharge protection circuit includes a protection period setting circuit which sets a first protection period of the precharge protection signal for the first command and sets a second protection period of the precharge protection signal for the second command, the second protection period being longer than the first protection period.

3. The semiconductor memory as claimed in claim 2, wherein the first and second protection periods start from an end of a sense operation of a sense amplifier.

4. The semiconductor memory as claimed in claim 2, wherein the protection period setting second circuit sets the first precharge protection period in a default state.

5. The semiconductor memory as claimed in claim 2, wherein the protection period setting second circuit sets the first protection period in a default state and switches to the second protection period when the second command is decoded.

6. The semiconductor memory as claimed in claim 5, the protection period setting circuit automatically switches to the first protection period from the second protection period after a given time elapses.

7. The semiconductor memory as claimed in claim 2, wherein:

the second command includes commands indicating a self refresh mode and an auto refresh mode defined in the dynamic random access memory.

8. A semiconductor memory comprising:

a command decoder which decodes a command externally supplied to the semiconductor memory;

a protection circuit which generates, in response to an output signal of the command decoder, a protection signal which is kept active for a predetermined period; and a circuit, coupled to the protection circuit, which inhibits an operation based on a change of the output signal of the command decoder during the predetermined period, wherein the predetermined period is set to a different time in response to the protection signal.

9. The semiconductor memory as claimed in claim 1, wherein the precharge protection circuit receives an internal row address strobe signal and delays the internal row address strobe signal to output the precharge protection signal, and wherein a delay time of the internal row address strobe signal changes depending on the command signal.

10. The semiconductor memory as claimed in claim 1, wherein a word line drive signal for activating a word line in the semiconductor memory is inactivated by the precharge protection signal during the protection period.

* * * * *